US012753978B2

(12) United States Patent
Mashiko et al.

(10) Patent No.: US 12,753,978 B2
(45) Date of Patent: Oct. 6, 2026

(54) COLD PLATE AND METHOD FOR MANUFACTURING COLD PLATE

(71) Applicant: Fujikura Ltd., Tokyo (JP)

(72) Inventors: Koichi Mashiko, Tokyo (JP); Masahiro Matsuda, Tokyo (JP)

(73) Assignee: Fujikura Ltd., Tokyo (JP)

( * ) Notice: Subject to any disclaimer, the term of this patent is extended or adjusted under 35 U.S.C. 154(b) by 620 days.

(21) Appl. No.: 17/499,954

(22) Filed: Oct. 13, 2021

(65) Prior Publication Data

US 2022/0128323 A1 Apr. 28, 2022

(30) Foreign Application Priority Data

Oct. 23, 2020 (JP) ................................ 2020-178103

(51) Int. Cl.

| | |
|---|---|
| ***F28F 3/12*** | (2006.01) |
| ***F28F 3/04*** | (2006.01) |
| ***F28F 13/08*** | (2006.01) |
| ***F28F 21/08*** | (2006.01) |
| ***H05K 7/20*** | (2006.01) |
| *F28D 21/00* | (2006.01) |

(52) U.S. Cl.

CPC ................ *F28F 3/12* (2013.01); *F28F 3/048* (2013.01); *F28F 13/08* (2013.01); *F28F 21/081* (2013.01); *F28F 21/089* (2013.01); *H05K 7/20254* (2013.01); *H05K 7/20509* (2013.01); *F28D 2021/0029* (2013.01); *F28F 2215/10* (2013.01)

(58) Field of Classification Search

CPC ......... F28F 3/12; F28F 3/048; H05K 7/20254
See application file for complete search history.

(56) References Cited

U.S. PATENT DOCUMENTS

2020/0227341 A1 7/2020 Neal et al.

FOREIGN PATENT DOCUMENTS

| | | | |
|---|---|---|---|
| JP | 2007180307 | A | 7/2007 |
| JP | 2012004405 | A | 1/2012 |
| JP | 2014079975 | A | 5/2014 |
| JP | 2014192409 | A | 10/2014 |
| JP | 2016015381 | A | 1/2016 |
| JP | 2018503934 | A | 2/2018 |
| JP | 2018081997 | A | 5/2018 |
| JP | 2018182043 | A | 11/2018 |
| JP | 6712915 | B2 | 6/2020 |
| WO | 2020138211 | A1 | 7/2020 |

*Primary Examiner* — Blaine Copenheaver

(74) *Attorney, Agent, or Firm* — Osha Bergman Watanabe & Burton LLP

(57) ABSTRACT

A cold plate includes: a metal plate on which a plurality of fins are disposed; and a resin cover which covers the plurality of fins. A roughened portion is disposed on a tip surface of at least one of the plurality of fins. The roughened portion and the resin cover are fused to each other.

6 Claims, 8 Drawing Sheets

COLD PLATE AND METHOD FOR MANUFACTURING COLD PLATE

CROSS-REFERENCE TO RELATED APPLICATIONS

This application claims priority to Japanese Patent Application No. 2020-178103, filed on Oct. 23, 2020, the content of which is incorporated herein by reference.

TECHNICAL FIELD

The present invention relates to a cold plate and a method for manufacturing a cold plate.

BACKGROUND

Japanese Patent No. 6712915 discloses a cold plate including a metal plate on which a plurality of fins are formed and a metal cover that covers the plurality of fins, peripheral edge portions of the metal plate and the metal cover being joined to each other by injection molding with resin.

SUMMARY

Due to an increase in heat generation density due to the high integration of electronic components in recent years, a demand for cold plates is expected to increase, and lower-priced cold plates are required. For this reason, it is being considered to replace the related-art metal cover with a resin cover. However, the resin cover has lower stiffness than the metal cover, and in a case where the pressure of the refrigerant flowing through the cold plate is high, there is a possibility that the resin cover swells and becomes deformed and cracking or the like occurs.

One or more embodiments of the present invention provide a cold plate and a method for manufacturing a cold plate which is capable of suppressing deformation of a resin cover due to the pressure of a refrigerant.

A cold plate according to one or more embodiments of the present invention includes a metal plate on which a plurality of fins are formed; and a resin cover which covers the plurality of fins, and a roughened portion is formed on a tip surface of at least one of the plurality of fins), and the roughened portion and the resin cover are fused to each other. According to this configuration, the fins and the resin cover are firmly fused to each other by the first roughened portion formed on the tip surfaces of the fins of the metal plate. The fins suppress the deformation of the resin cover from the inside of the peripheral edge portion of the resin cover. For this reason, the swelling deformation of the resin cover due to the pressure of the refrigerant can be suppressed.

In the above cold plate, a second roughened portion may be formed on a peripheral edge portion of the metal plate which surrounds the plurality of fins, and the second roughened portion and the resin cover may be fused to each other.

In the above cold plate, a plurality of recessed portions into which tip portions of the plurality of fins are inserted may be formed on the resin cover.

In the above cold plate, in the resin cover, a plurality of protruding portions inserted into gaps of the plurality of fins may be formed between the plurality of recessed portions, and tip surfaces of the plurality of protruding portions may be curved in a convex shape toward the metal plate in a longitudinal direction in which the plurality of fins extend.

In the above cold plate, a refrigerant distribution flow path communicating with gaps between the plurality of fins may be formed on the resin cover, and a second protruding portion extending along the refrigerant distribution flow path and protruding toward the metal plate may be formed on the resin cover. A second recessed portion fitting with the second protruding portion may be formed on a tip portion of at least one of the plurality of fins.

In the above cold plate, the refrigerant distribution flow path may be formed at a central portion in a longitudinal direction in which the plurality of fins extend.

A method for manufacturing a cold plate according to one or more embodiments of the present invention is a method for manufacturing a cold plate including a metal plate on which a plurality of fins are formed and a resin cover covering the plurality of fins, the method including a step of forming a roughened portion on a tip surface of at least one of the plurality of fins; and a step of heat-fusing the roughened portion and the resin cover to each other.

According to this method, the fins and the resin cover are firmly fused to each other by the roughened portion formed on the tip surfaces of the fins of the metal plate. The fins suppress the deformation of the resin cover from the inside of the peripheral edge portion of the resin cover. For this reason, the swelling deformation of the resin cover due to the pressure of the refrigerant can be suppressed.

In the above method for manufacturing a cold plate, the roughened portion may be formed on a tip surface of at least one of the plurality of fins by chemical conversion treatment or laser irradiation.

The above method for manufacturing a cold plate may further include a step of forming a second roughened portion on a peripheral edge portion of the metal plate which surrounds the plurality of fins; and a step of heat-fusing the second roughened portion and the resin cover to each other.

In the above method for manufacturing a cold plate, the step of heat-fusing the roughened portion and the resin cover to each other and the step of heat-fusing the second roughened portion and the resin cover to each other may be simultaneously performed.

According to one or more embodiments of the present invention, it is possible to provide a cold plate which is capable of suppressing deformation of the resin cover due to the pressure of the refrigerant.

DETAILED DESCRIPTION

Hereinafter, embodiments of the present invention will be described with reference to the drawings.

Figure 1:
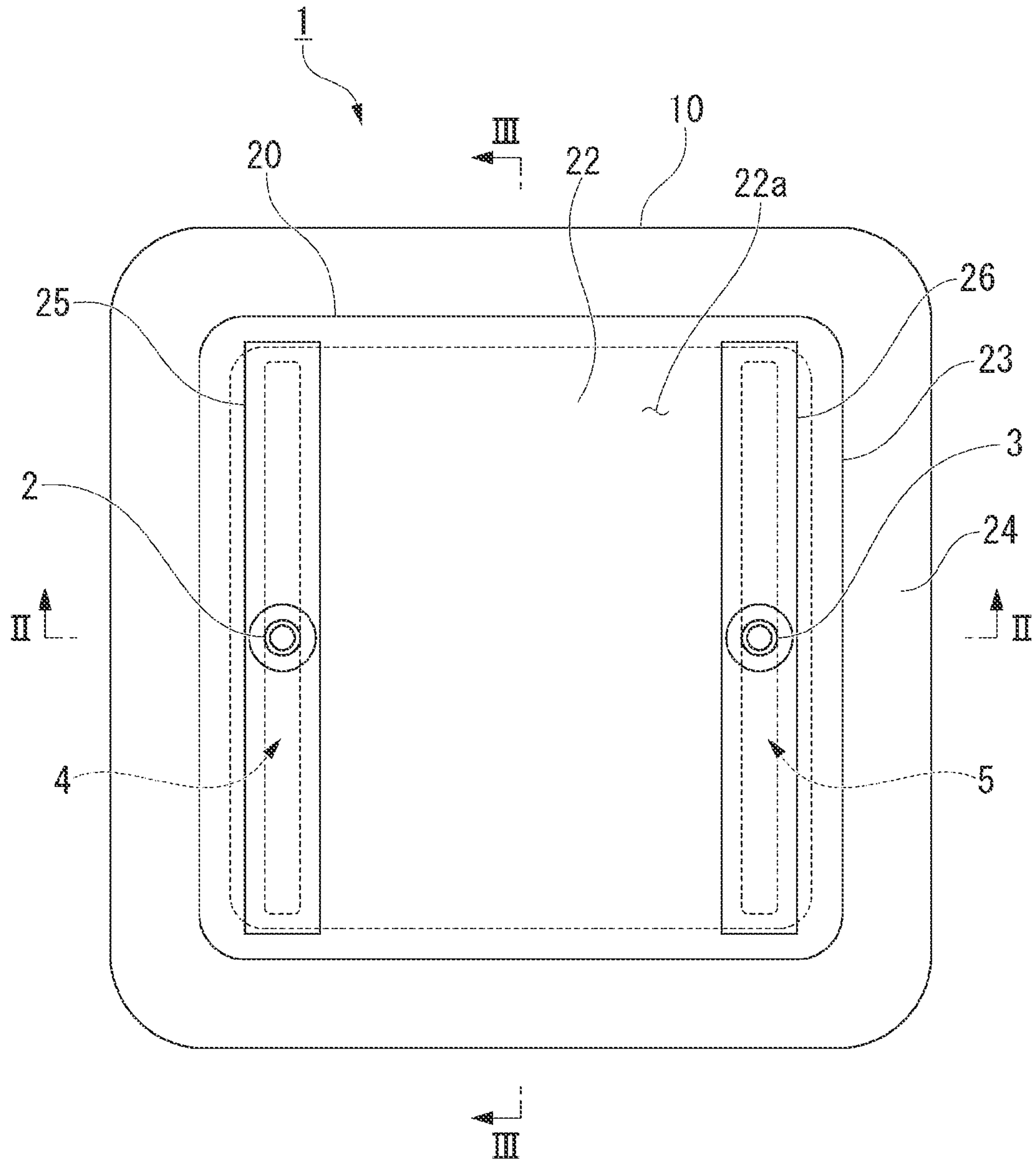
FIG. 1 is a plan view of a cold plate according to one or more embodiments.

FIG. 1 is a plan view of a cold plate 1 according to one or more embodiments.

Figure 2:
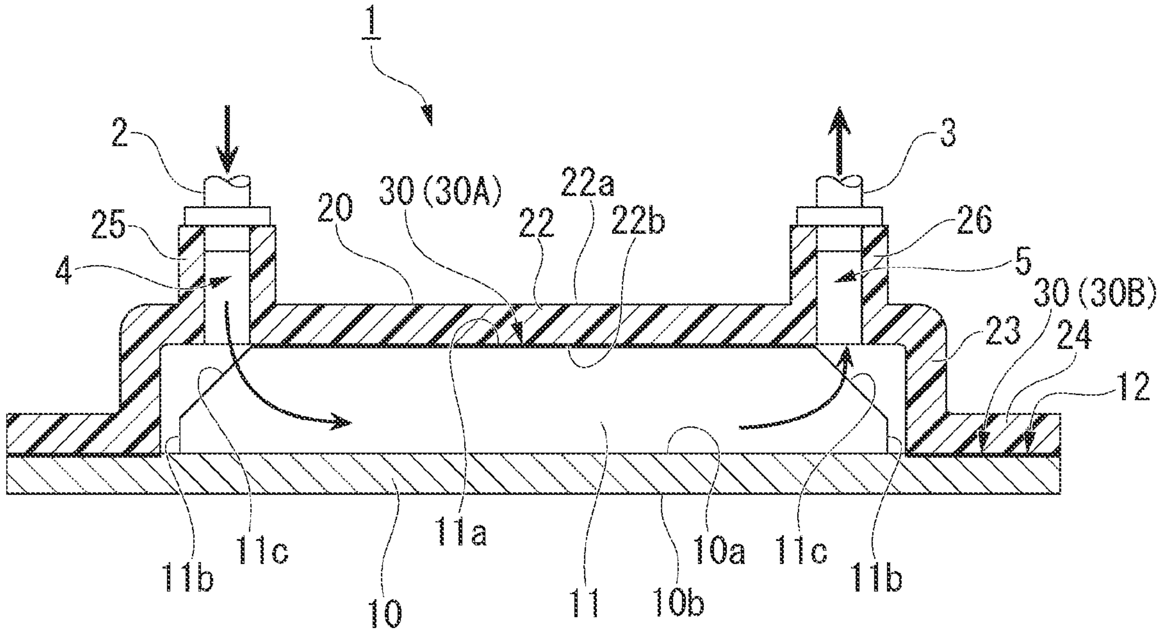
FIG. 2 is a cross-sectional view taken along line II-II shown in FIG. 1.
Figure 3:
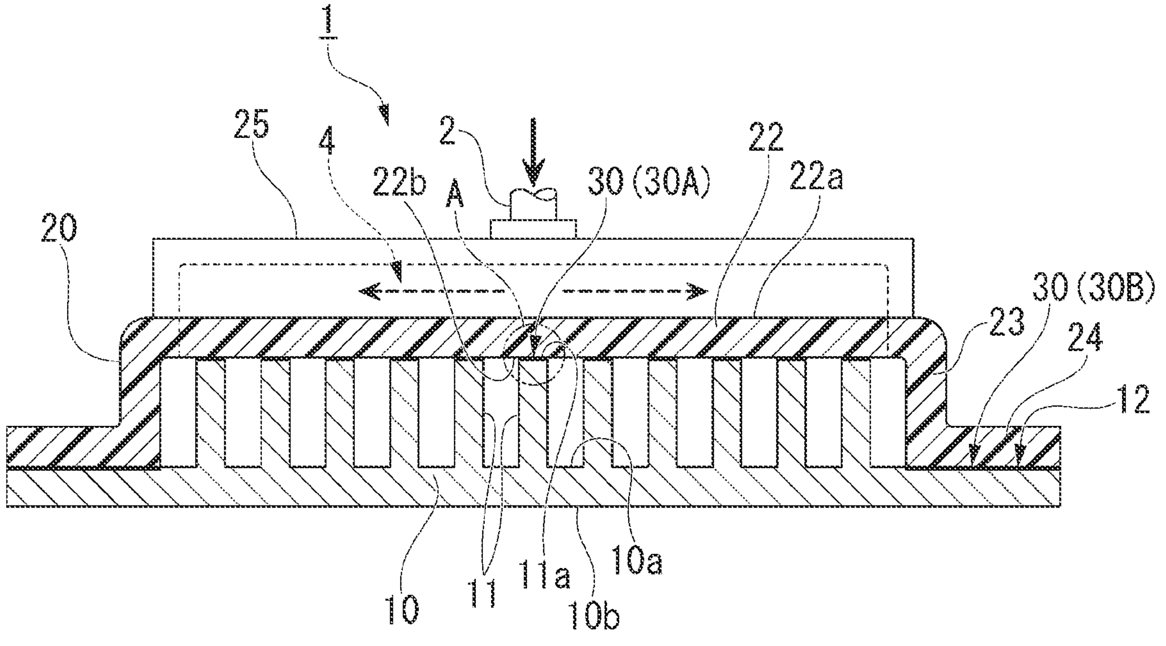
FIG. 3 is a cross-sectional view taken along line III-III shown in FIG. 1.
Figure 4:
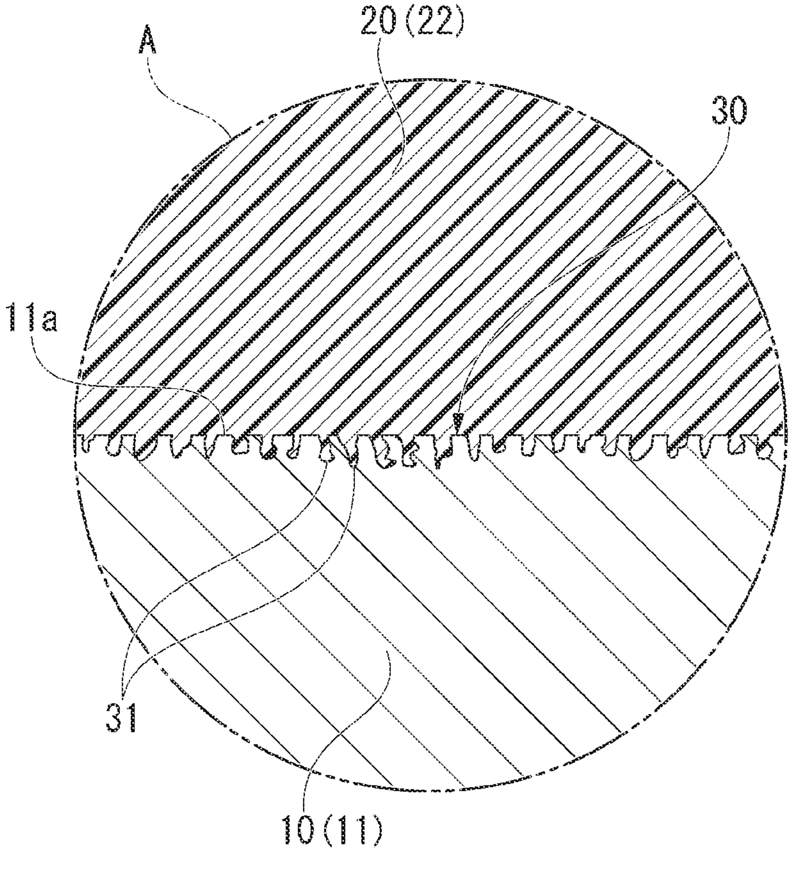
FIG. 4 is an enlarged view of a region A shown in FIG. 3.

FIG. 2 is a cross-sectional view taken along line II-II shown in FIG. 1. FIG. 3 is a cross-sectional view taken along line III-III shown in FIG. 1. FIG. 4 is an enlarged view of a region A shown in FIG. 3.

As shown in these figures, the cold plate 1 includes a metal plate 10 on which a plurality of fins 11 are formed, and a resin cover 20 that covers the plurality of fins 11.

The metal plate 10 is formed of, for example, a metal having excellent thermal conductivity such as copper, a copper alloy, aluminum, or an aluminum alloy. As shown in FIG. 3, the plurality of fins 11 are formed on one plate surface 10*a* of the metal plate 10. The plurality of fins 11 are formed in parallel at regular intervals on the plate surface 10*a*. In addition, the other plate surface 10*b* of the metal plate 10 is a flat surface. Heat-generating components and the like (not shown) come into contact with the plate surface 10*b*.

The fins 11 are formed in a plate shape that stands perpendicular to the plate surface 10*a*. As shown in FIG. 2, a tip surface 11*a*, which is an upper end of the fin 11, extends parallel to the plate surface 10*a*. Side end surfaces 11*b*, which are both ends in a longitudinal direction of the fin 11, extend perpendicularly to the plate surface 10*a*. The tip surface 11*a* and the side end surfaces 11*b* are connected to each other by an inclined surface 11*c*. The inclined surface 11*c* is disposed so as to face a refrigerant distribution flow path 4 and a refrigerant recovery flow path 5, which will be described below.

The resin cover 20 is formed of a lightweight and low-cost resin such as polyphenylene sulfide (PPS), nylon, polypropylene, polybutylene terephthalate, polycarbonate, and ABS resin. The resin cover 20 is formed in a topped tubular shape (also referred to as a bowl shape). The resin cover 20 includes a top wall portion 22 and a peripheral wall portion 23 connected to an outer peripheral portion of the top wall portion 22.

As shown in FIG. 1, the top wall portion 22 is formed in a rectangular shape in plan view. The peripheral wall portion 23 is formed in a rectangular tubular shape (also referred to as an angular tubular shape). A flange portion 24 (also referred to as a collar portion) extending outward is formed at an opening end portion (lower end portion) of the peripheral wall portion 23. In addition, in the plan view shown in FIG. 1, the outer shape of the flange portion 24 (resin cover 20) is the same as the outer shape of the metal plate 10, but the metal plate 10 may be larger.

An inlet-side manifold 25 to which a refrigerant inlet pipe 2 is connected and an outlet-side manifold 26 to which a refrigerant outlet pipe 3 is connected are formed on the top wall portion 22. As shown in FIG. 2, the inlet-side manifold 25 protrudes upward from an upper surface 22*a* of the top wall portion 22. The refrigerant distribution flow path 4, which communicates with a space on one end side of the plurality of fins 11, is formed inside the inlet-side manifold 25. The refrigerant distribution flow path 4 extends in a direction orthogonal to the plurality of fins 11 in plan view.

The outlet-side manifold 26 also protrudes upward from the upper surface 22*a* of the top wall portion 22 similar to the inlet-side manifold 25. The refrigerant recovery flow path 5, which communicates with a space on the other end side of the plurality of fins 11, is formed inside the outlet-side manifold 26. The refrigerant recovery flow path 5 extends in the direction orthogonal to the plurality of fins 11 in plan view.

The refrigerant, which has flowed in from the refrigerant inlet pipe 2, flows out from the refrigerant outlet pipe 3 through the refrigerant distribution flow path 4, gaps (slits) between the plurality of fins 11, and the refrigerant recovery flow path 5.

Since the cold plate 1 of one or more embodiments includes the inlet-side manifold 25 (refrigerant distribution flow path 4) and the outlet-side manifold 26 (refrigerant recovery flow path 5) at a height equal to or higher than the top wall portion 22 of the resin cover 20, it is easier to achieve downsizing in a planar direction along the plate surface 10*a* of the metal plate 10 than in the related art.

The plurality of fins 11 pass directly under the refrigerant distribution flow path 4 and the refrigerant recovery flow path 5 and extend to the vicinity of the peripheral wall portion 23. The plurality of fins 11 includes the inclined surface 11*c* so as not to narrow an outlet of the refrigerant distribution flow path 4 and an inlet of the refrigerant recovery flow path 5. The plurality of fins 11 are spaced apart from the refrigerant distribution flow path 4 and the refrigerant recovery flow path 5.

As shown in FIG. 3, the tip surfaces 11*a* of the plurality of fins 11 are fused with the lower surface 22*b* of the top wall portion 22 of the resin cover 20. Explaining a fusing principle between each fin 11 and the resin cover 20, as shown in FIG. 4, a roughened portion 30 is formed on the tip surface 11*a* of the fin 11 in contact with the resin cover 20 by surface treatment. The roughened portion 30 includes a plurality of micropores 31.

The resin cover 20 is pressed against the tip surface 11*a* of the fin 11 that has been roughened in this way, and heat-crimped. Accordingly, a part of the resin cover 20 is softened or melted, enters the micropores 31, and is then solidified. As a result, the resin that has entered the micropores 31 serves as an anchor, and the fin 11 and the resin cover 20 are joined to each other.

Returning to FIG. 2, the resin cover 20 is fused to a peripheral edge portion 12 of the metal plate 10 such that the opening end portion of the peripheral wall portion 23 faces the plate surface 10*a* of the metal plate 10. A roughened portion 30 (hereinafter, also referred to as a second roughened portion 30B) similar to the roughened portion 30 (hereinafter, also referred to as a first roughened portion 30A) of the tip surface 11*a* of the fin 11 is formed at the peripheral edge portion 12 of the metal plate 10. The peripheral edge portion 12 of the metal plate 10 is also joined to the resin cover 20 by the same fusing principle as in FIG. 4.

Figure 5:
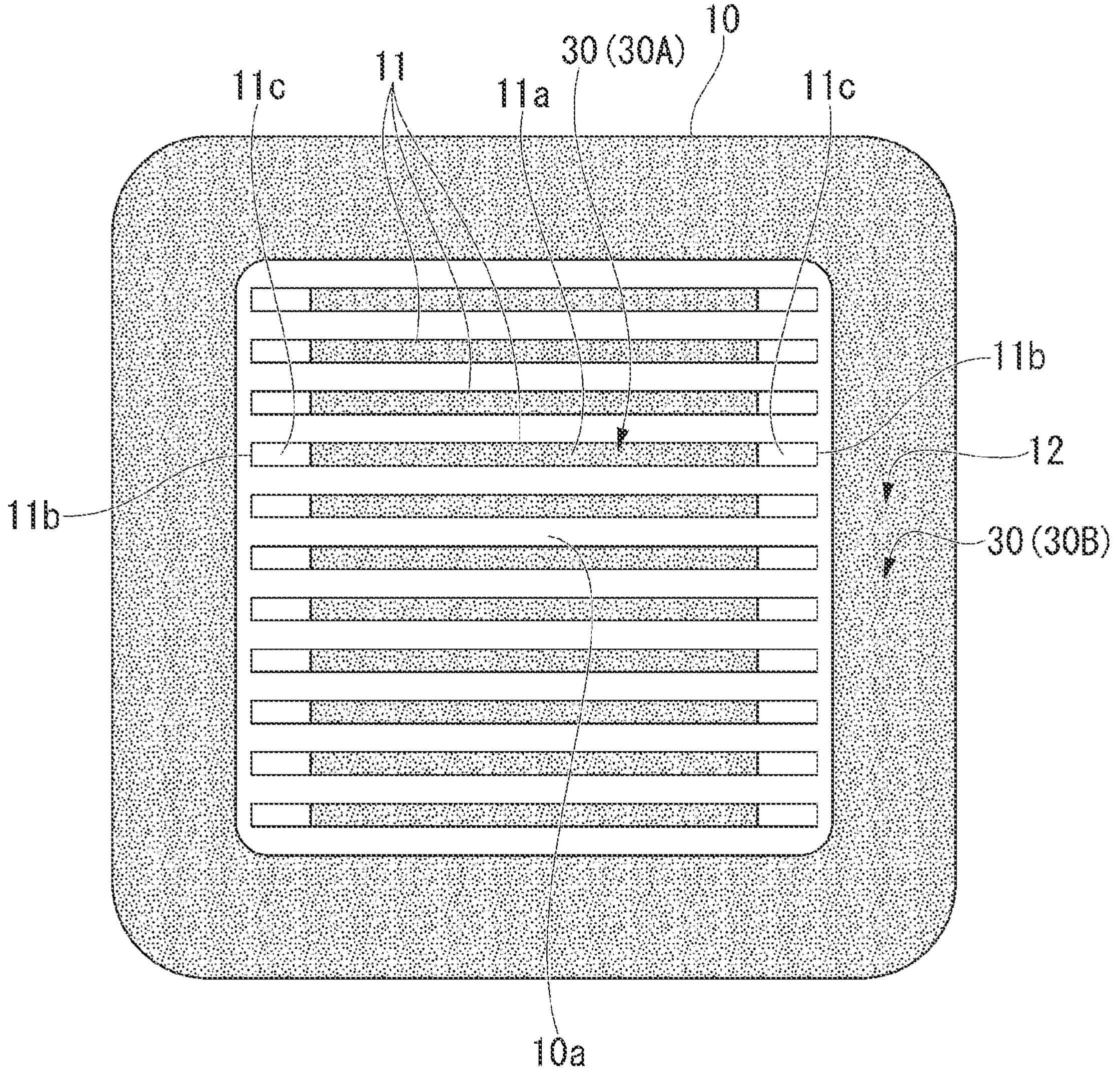
FIG. 5 is a plan view of a metal plate according to one or more embodiments.

FIG. 5 is a plan view of the metal plate 10 according to one or more embodiments.

As shown in FIG. 5, the metal plate 10 includes the first roughened portion 30A and the second roughened portion 30B. The first roughened portion 30A is formed on the tip surfaces 11*a* of the plurality of fins 11. The second roughened portion 30B is formed on the peripheral edge portion 12 of the metal plate 10 surrounding the plurality of fins 11.

The roughened portion 30 can be formed by chemical conversion treatment such as etching on the metal plate 10 or by laser irradiation. The first roughened portion 30A and the second roughened portion 30B may be formed at the same time or in the same step by the above-described treatment. However, in the case of the chemical conversion treatment, it is necessary to mask a portion that is not roughened. Additionally, in the case of the laser irradiation, it takes a substantial amount of time to perform laser scanning on a wide area such as the peripheral edge portion 12 of the metal plate 10. For this reason, the following manufacturing method may be adopted.

Figure 6:
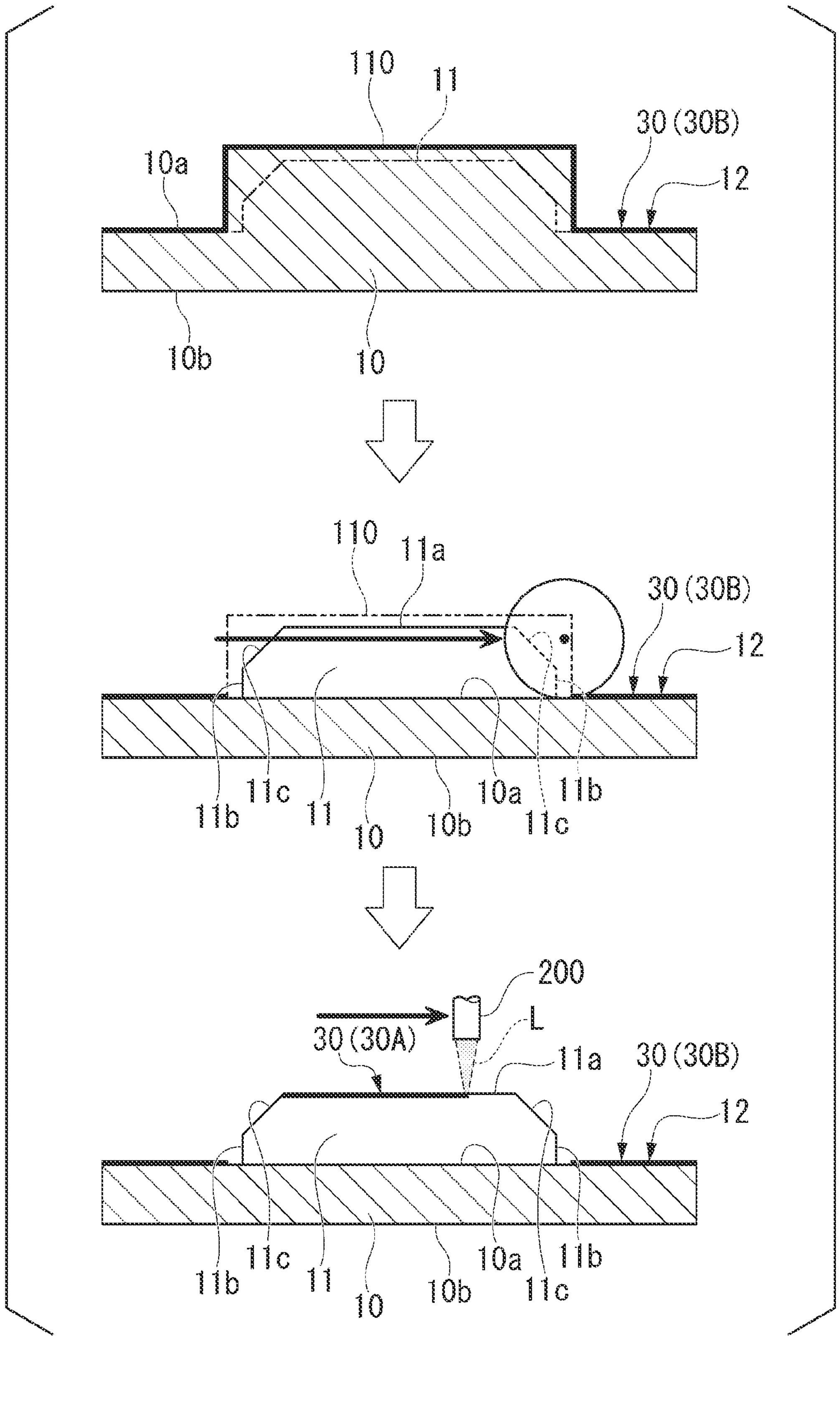
FIG. 6 is an explanatory view showing one step of a method for manufacturing a cold plate according to one or more embodiments.

FIG. 6 is an explanatory view showing one step of the method for manufacturing the cold plate 1 according to one or more embodiments.

The method for manufacturing the cold plate 1 generally includes a step of forming the roughened portion 30 on the metal plate 10 (the fins 11 and the peripheral edge portion 12) and a step of heat-fusing the roughened portion 30 and the resin cover 20. FIG. 6 shows the step of forming the roughened portion 30 on the metal plate 10.

In this step, first, the roughened portion 30 is formed by the chemical conversion treatment in a state where a shaved portion 110 for shaving the plurality of fins 11 is formed on the metal plate 10. The shaved portion 110 is configured by being shaved off from a base material forming the metal plate 10. The shaved portion 110 is formed together with the plate surface 10*a* and the like by machining. The second roughened portion 30B is formed on the peripheral edge portion 12 of the metal plate 10 by roughening one surface on the plate surface 10*a* side including the shaved portion 110 by the chemical conversion treatment.

Next, the shaved portion 110 is cut to form the plurality of fins 11. The plurality of fins 11 can be formed, for example, by cutting the shaved portion 110 with a rotating metal saw. For example, the metal saw forms one recessed portion in the shaved portion 110, then rises and is offset in the width direction of the shaved portion 110 by a predetermined amount, and then descends again to form a recessed portion adjacent to the recessed portion. By repeating this operation, the plurality of fins 11 are formed. In addition, the roughened portion 30 on the surface of the shaved portion 110 is removed by this cutting.

Next, the tip surfaces 11*a* of the plurality of fins 11 are roughened by irradiation with the laser L. The first roughened portion 30A can be formed by performing scanning with the laser L along the tip surface 11*a* of each fin 11 using, for example, a laser irradiation device 200. For example, the laser irradiation device 200 forms the first roughened portion 30A on one of the plurality of fins 11, offsets in the width direction of the plurality of fins 11 by a predetermined amount, performs scanning with the laser L along the tip surface 11*a* of the fin 11 adjacent to the fin 11, and forms the first roughened portion 30A. By repeating this operation, the first roughened portion 30A is selectively formed on the tip surfaces 11*a* of the plurality of fins 11. The laser irradiation may be performed in a direction perpendicular to the longitudinal direction of the tip surface 11*a* of the fin 11 (the direction perpendicular to the direction indicated by the arrow in FIG. 6).

After the roughened portion 30 is formed on the metal plate 10 (the fins 11 and the peripheral edge portion 12) in this way, the metal plate 10 is covered with the resin cover 20. And then, the roughened portion 30 and the resin cover 20 are heat-fused to each other. In addition, when the resin cover 20 is heat-fused to the roughened portion 30 of the metal plate 10, it is preferable to pressurize the resin cover 20. From the above, the cold plate 1 can be manufactured.

According to the above-described method, instead of the laser irradiation, which takes substantial time to roughen a wide area, the second roughened portion 30B is formed on the peripheral edge portion 12 of the metal plate 10 by the chemical conversion treatment, and instead of the chemical conversion treatment that requires a fine mask, the first roughened portion 30A can be selectively formed on the tip surfaces 11*a* of the plurality of fins 11 by the laser irradiation.

Meanwhile, in the cold plate 1 having the above configuration, it is preferable that the number of fins 11 is large in order to increase the heat exchange area with the refrigerant. Accordingly, the width of a gap between the fins 11 is narrowed and the flow resistance is increased. The refrigerant is supplied to the inside of the resin cover 20 at a somewhat high pressure such that the refrigerant can flow at a sufficient speed to overcome the flow resistance. For that reason, the pressure inside the resin cover 20 becomes high.

In one or more embodiments, the fins 11 and the resin cover 20 are firmly fused to each other by the first roughened portion 30A formed on the tip surfaces 11*a* of the fins 11 of the metal plate 10. The fins 11 suppress deformation of the resin cover 20 at a substantially central portion of the resin cover 20. For this reason, the swelling deformation of the resin cover 20 due to the pressure of the refrigerant (for example, the deformation of the top wall portion 22 that tends to swell in a dome shape) can be suppressed. Thereby, the resin cover 20 can be prevented from cracking or the like.

In this way, the cold plate 1 of one or more embodiments described above includes the metal plate 10 on which the plurality of fins 11 are formed and the resin cover 20 that covers the plurality of fins 11. The roughened portion 30 (first roughened portion 30A) is formed on a tip surface 11*a* of at least one of the plurality of fins 11, and the roughened portion 30 and the resin cover 20 are fused to each other. Therefore, the deformation of the resin cover 20 due to the pressure of the refrigerant can be suppressed.

Additionally, in the cold plate 1 of one or more embodiments, the second roughened portion 30B is formed on the peripheral edge portion 12 of the metal plate 10 surrounding the plurality of fins 11, and the second roughened portion 30B and the resin cover 20 are fused to each other. According to this configuration, the joining strength of the peripheral edge portion 12 of the metal plate 10 with the resin cover 20 can be increased, and the sealing performance can be improved.

Additionally, according to the method for manufacturing the cold plate 1 of one or more embodiments described above, the step of forming the roughened portion 30 (first roughened portion 30A) on the tip surface 11*a* of at least one of the plurality of fins 11 and the step of heat-fusing the roughened portion 30 and the resin cover 20 are provided. Therefore, the fins 11 of the metal plate 10 and the resin cover 20 can be firmly fused to each other. Since the fins 11 suppress the deformation of the resin cover 20 from the inside of the peripheral edge portion of the resin cover 20, the swelling deformation of the resin cover 20 due to the pressure of the refrigerant can be suppressed.

Additionally, in the method for manufacturing the cold plate 1 of one or more embodiments, the roughened portion 30 is formed by the chemical conversion treatment on or laser irradiation to the tip surface 11*a* of at least one of the plurality of fins 11. According to this method, the roughened portion 30 can be easily formed.

Additionally, in the method for manufacturing the cold plate 1 of one or more embodiments, a step of forming the second roughened portion 30B on the peripheral edge portion 12 of the metal plate 10 surrounding the plurality of fins 11 and a step of heat-fusing the second roughened portion 30B and the resin cover 20 to each other are provided. According to this method, the joining strength of the peripheral edge portion 12 of the metal plate 10 with the resin cover 20 can be increased, and the sealing performance can be improved.

Additionally, in the method for manufacturing the cold plate 1 of one or more embodiments, the step of heat-fusing the first roughened portion 30A and the resin cover 20 to each other and the step of heat-fusing the second roughened portion 30B and the resin cover 20 are simultaneously performed. According to this method, the cold plate 1 can be efficiently manufactured.

Next, additional embodiments of the present invention will be described below. In the following description, the same or equivalent components as those in the above-described embodiments are designated by the same reference numerals, and the description thereof will be simplified or omitted.

Figure 7:
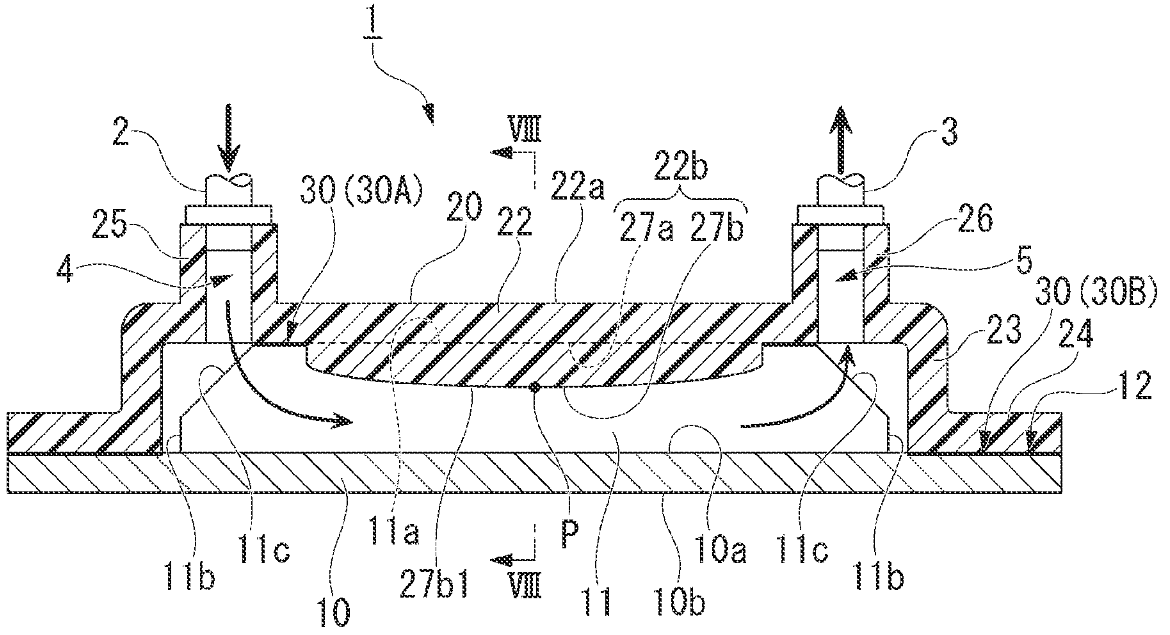
FIG. 7 is a cross-sectional configuration view of a cold plate according to one or more embodiments.
Figure 8:
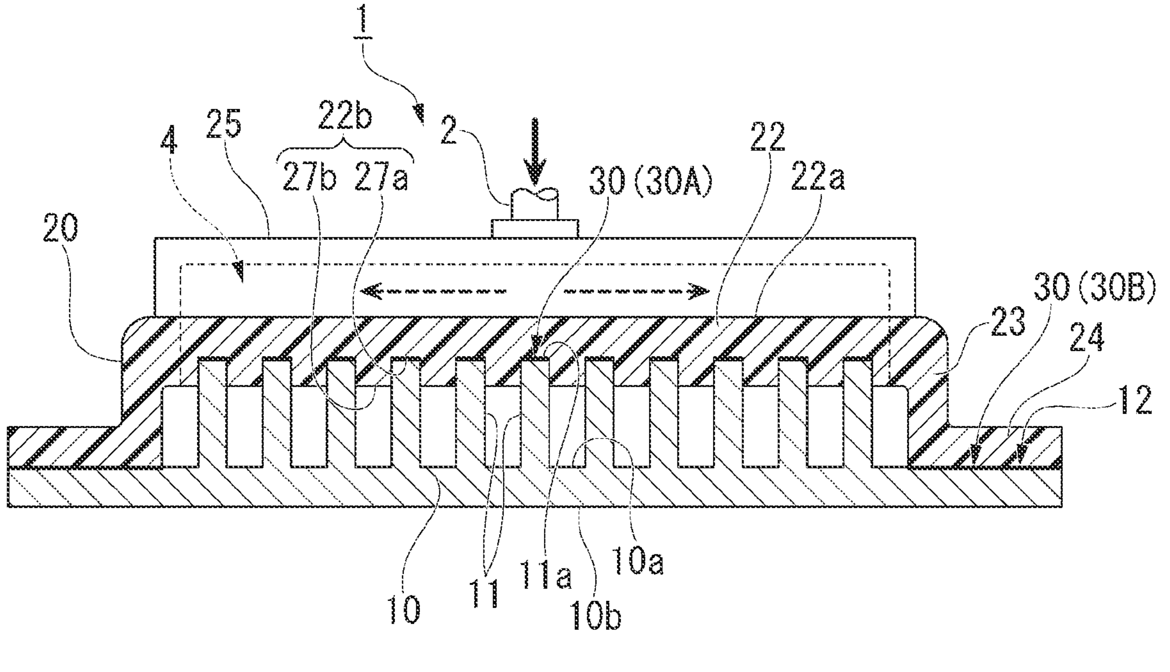
FIG. 8 is a cross-sectional view taken along line VIII-VIII shown in FIG. 7.

FIG. 7 is a cross-sectional configuration view of the cold plate 1 according to one or more embodiments. FIG. 8 is a cross-sectional view taken along a line VIII-VIII shown in FIG. 7.

As shown in FIG. 8, the resin cover 20 of one or more embodiments includes recessed portions 27*a* and protruding portions 27*b* on the lower surface 22*b* of the top wall portion 22.

Tip portions of a plurality of fins 11 are inserted into the recessed portions 27*a*. In addition, the tip portion of each fin 11 refers to a portion including the tip surface 11*a* and both side surfaces in the vicinity of the tip surface 11*a*.

Each protruding portion 27*b* is formed between the plurality of recessed portions 27*a*. The protruding portion 27*b* is inserted into a gap between the plurality of fins 11.

As shown in FIG. 7, the protruding portion 27*b* is curved in a convex shape toward the plate surface 10*a* of the metal plate 10 in the longitudinal direction in which the fin 11 extends. Specifically, the protruding portion 27*b* has a streamlined tip surface 27*b*1 that is closest to the plate surface 10*a* at an intermediate position P in the longitudinal direction of the fin 11, and is gradually spaced apart from the plate surface 10*a* as it moves away from the intermediate position P to both sides in the longitudinal direction.

According to one or more embodiments of the above configuration, as shown in FIG. 8, the plurality of recessed portions 27*a* into which the tip portions of the plurality of fins 11 are inserted are formed on the resin cover 20. Therefore, by fitting the fins 11 and the resin cover 20 (recessed portions 27*a*) in addition to the fusion between each fin 11 and the resin cover 20, the joining strength is improved, and the swelling deformation of the resin cover 20 can be reliably suppressed. Additionally, the presence of the recessed portions 27*a* into which the fins 11 are inserted facilitates the alignment between the metal plate 10 and the resin cover 20, and it is easy to join the metal plate 10 and the resin cover 20 by the recessed portions 27*a*.

Additionally, according to one or more embodiments, the resin cover 20 has the plurality of protruding portions 27*b* inserted into the gaps between the plurality of fins 11 formed between the plurality of recessed portions 27*a*. As shown in FIG. 7, the tip surfaces 27*b*1 of the plurality of protruding portions 27*b* are curved in a convex shape toward the metal plate 10 in the longitudinal direction in which the plurality of fins 11 extend. According to this configuration, since the flow velocity of the refrigerant increases at a central portion in the longitudinal direction of the fin 11, a bottom plate side of the metal plate 10 on which the heat-generating components are disposed can be forcibly cooled.

Next, additional embodiments of the present invention will be described below. In the following description, the same or equivalent components as those in the above-described embodiments are designated by the same reference numerals, and the description thereof will be simplified or omitted.

Figure 9:
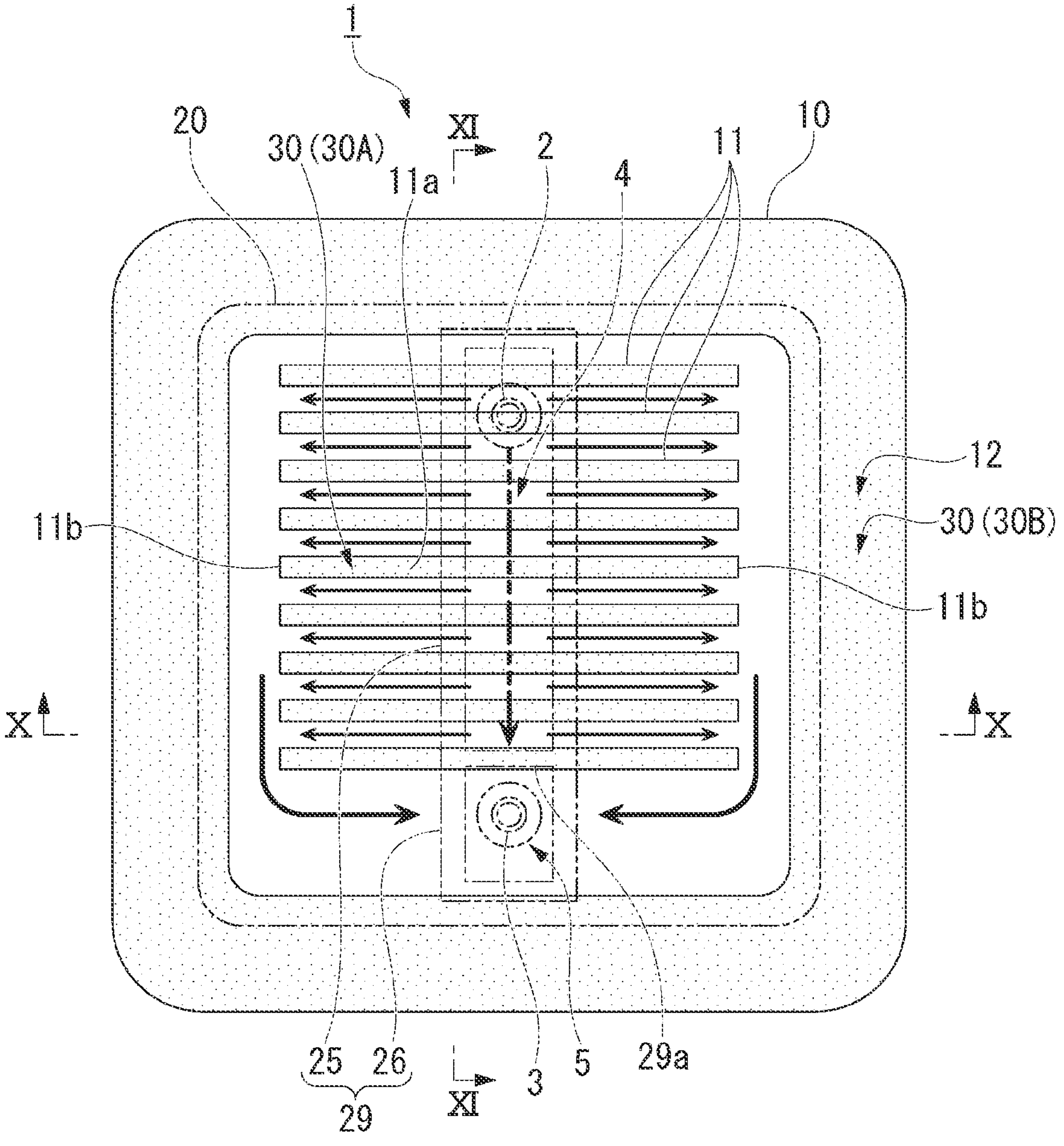
FIG. 9 is a plan view of a cold plate according to one or more embodiments.
Figure 10:
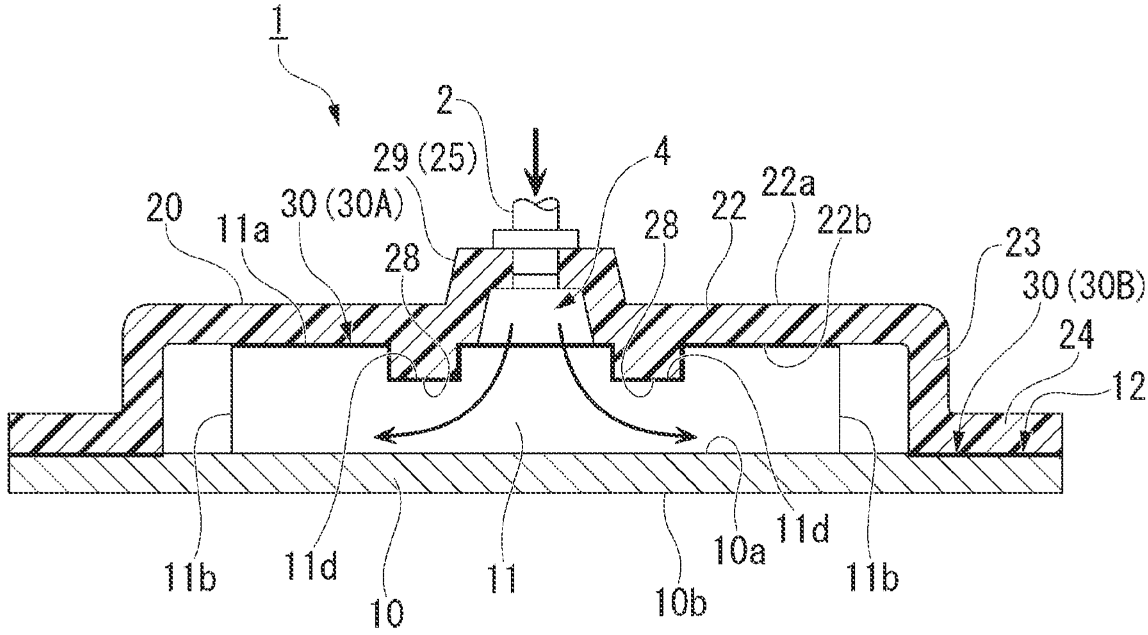
FIG. 10 is a cross-sectional view taken along line X-X shown in FIG. 9.
Figure 11:
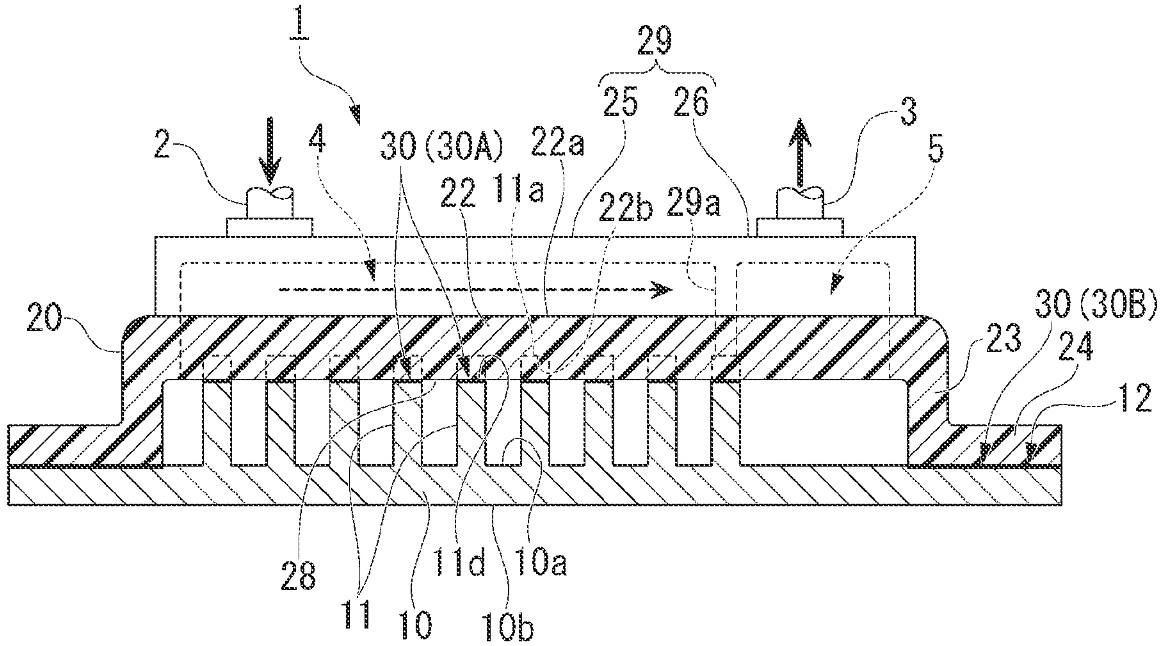
FIG. 11 is a cross-sectional view taken along line XI-XI shown in FIG. 9.

FIG. 9 is a plan view of the cold plate 1 according to one or more embodiments. In addition, in FIG. 9, the resin cover 20 is shown by a chain double-dashed line in order to make it easier to visually recognize the flow of the refrigerant. FIG. 10 is a cross-sectional view taken along line X-X shown in FIG. 9. FIG. 11 is a cross-sectional view taken along line XI-XI shown in FIG. 9.

As shown in FIG. 10, in the cold plate 1 of one or more embodiments, a second protruding portion 28 protruding toward the metal plate 10 is formed on the resin cover 20. A second recessed portion 11*d* fitting with the second protruding portion 28 is formed on a tip portion of at least one of the plurality of fins 11.

The refrigerant distribution flow path 4 and the refrigerant recovery flow path 5 of one or more embodiments are formed at the central portion in the longitudinal direction in which the plurality of fins 11 extend. As shown in FIGS. 9 and 11, the resin cover 20 of one or more embodiments includes an inlet and outlet manifold 29. The inlet and outlet manifold 29 is configured such that the inlet-side manifold 25 in which the refrigerant distribution flow path 4 is formed and the outlet-side manifold 26 in which the refrigerant recovery flow path 5 is formed are integrated with each other. A partition wall 29*a* forming partitioning between the refrigerant distribution flow path 4 and the refrigerant recovery flow path 5 is formed inside the inlet and outlet manifold 29.

As shown in FIG. 9, the refrigerant, which has flowed in from the refrigerant distribution flow path 4, escapes from the central portion in the longitudinal direction of the plurality of fins 11 to both end portions in the longitudinal direction. And then, the refrigerant passes through the gaps between both end portions in the longitudinal direction of the plurality of fins 11 and the resin cover 20, and is recovered from the refrigerant recovery flow path 5 disposed outside the formation range of the plurality of fins 11.

The second protruding portion 28 extends along both sides of the refrigerant distribution flow path 4 in the direction orthogonal to the plurality of fins 11. As shown in FIG. 10, the second protruding portion 28 protrudes downward from the lower surface 22*b* of the top wall portion 22 of the resin cover 20.

The second recessed portion 11*d* has a shape corresponding to the second protruding portion 28. The roughened portion 30 is also formed on the surface of the second recessed portion 11*d*.

According to one or more embodiments of the above configuration, the refrigerant distribution flow path 4 communicating with the gaps between the plurality of fins 11, and the second protruding portion 28 extending along the refrigerant distribution flow path 4 and protruding toward the metal plate 10 are formed on the resin cover 20. The second recessed portion 11*d* that fits to the second protruding portion 28 is formed on the tip portion of at least one of the plurality of fins 11. Therefore, the joining strength is improved by fitting the second protruding portion 28 and the second recessed portion 11*d* to each other in addition to the fusion between each fin 11 and the resin cover 20.

Additionally, by forming the roughened portion 30 also in the second recessed portion 11*d* and increasing the area of the roughened portion 30, the joining strength at a fused portion between each fin 11 and the resin cover 20 is improved. Moreover, in the refrigerant distribution flow path 4 that is an inflow port of the refrigerant, the pressure of the refrigerant is likely to increase. Therefore, by providing the second protruding portion 28 along the refrigerant distribution flow path 4, the swelling deformation of the resin cover 20 can be effectively suppressed.

Additionally, according to one or more embodiments, the refrigerant distribution flow path 4 is formed at the central portion in the longitudinal direction in which the plurality of fins 11 extend, and the second protruding portion 28 is also disposed substantially at the central portion in the longitudinal direction in which the plurality of fins 11 extend. Therefore, the deformation of the top wall portion 22 of the resin cover 20 that tends to swell in a dome shape can be reliably suppressed.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

For example, in the above embodiments, a configuration in which the roughened portion 30 is formed on all the tip surfaces 11*a* of the plurality of fins 11 has been described, but the roughened portion 30 may be formed on the tip surface 11*a* of at least one of the plurality of fins 11. Additionally, the metal plate 10 may alternately include a fin 11 having the roughened portion 30 formed on the tip surface 11*a* and a fin 11 having no roughened portion 30 formed on the tip surface 11*a*.

Additionally, for example, in the above embodiments, a configuration in which the peripheral edge portions of the metal plate 10 and the resin cover 20 are joined to each other by the heat-fusing has been described. However, by applying the related art, a configuration in which the peripheral edge portions of the metal plate 10 and the resin cover 20 are joined to each other by the injection molding with resin may be adopted. Additionally, a configuration in which the peripheral edge portions of the metal plate 10 and of the resin cover 20 are fastened and fixed to each other by fixing tools such as bolts and nuts may be adopted.

What is claimed is:

1. A cold plate, comprising:

a metal plate;

fins disposed on the metal plate such that tip portions of the fins are away from the metal plate and such that gaps are formed between each adjacent ones of the fins; and a resin cover that covers the fins, wherein one of the tip portions of the fins has a tip surface that has a first roughened portion that is fused to the resin cover, the resin cover comprises protruding portions that protrude toward the metal plate, the resin cover forms, between the protruding portions, a refrigerant distribution flow path that communicates with the gaps between the adjacent ones of the fins, one of the tip portions of the fins comprises a recessed portion that extends in an entire thickness of the one of the tip portions of the fins, the recessed portion engages with one of the protruding portions of the resin cover, and a bottom of the recessed portion has a roughened surface that is fused to one of the protruding portions of the resin cover.

2. A cold plate, comprising:

a metal plate;

fins disposed on the metal plate such that tip portions of the fins are away from the metal plate; and a resin cover that covers the fins, wherein one of the tip portions of the fins has a tip surface that has a first roughened portion that is fused to the resin cover, and the resin cover comprises recessed portions and first protruding portions alternately disposed in a direction of the fins being disposed, each of the tip portions is fully inserted into a corresponding one of the recessed portions such that each of the tip portions fills the corresponding one of the recessed portions, and each of the fins is fitted between adjacent ones of the first protruding portions of the resin cover.

3. The cold plate according to claim 2, wherein a peripheral edge portion of the metal plate surrounds the fins and has a second roughened portion that is fused to the resin cover.

4. The cold plate according to claim 2, wherein tips of the first protruding portions are curved in a convex shape toward the metal plate in a longitudinal direction in which the fins extend.

5. The cold plate according to claim 2, wherein the resin cover forms a refrigerant distribution flow path that communicates with gaps between adjacent ones of the fins, the resin cover comprises a second protruding portion that extends along the refrigerant distribution flow path and protrudes toward the metal plate, and one of the tip portions of the fins comprises a recessed portion that engages with the second protruding portion of the resin cover.

6. The cold plate according to claim 5, wherein the refrigerant distribution flow path is disposed at a central portion of the resin cover in a longitudinal direction in which the fins extend.

* * * * *